United States Patent
Bristol

[19]

[11] Patent Number: 5,774,385
[45] Date of Patent: Jun. 30, 1998

[54] METHOD AND APPARATUS FOR DATA COMPRESSION

[75] Inventor: Edgar H. Bristol, Foxboro, Mass.

[73] Assignee: The Foxboro Company, Foxboro, Mass.

[21] Appl. No.: 708,808

[22] Filed: Sep. 9, 1996

[51] Int. Cl.⁶ .................................................. G06F 7/00
[52] U.S. Cl. ..................................................... 364/715.02
[58] Field of Search .................... 364/715.02; 382/241, 382/242, 243; 358/426

[56] References Cited

U.S. PATENT DOCUMENTS

| | | | |
|---|---|---|---|
| 4,513,444 | 4/1985 | Okai et al. | 382/242 |
| 4,669,097 | 5/1987 | Bristol | 375/240 |
| 5,255,365 | 10/1993 | Hungenbuhler | 345/507 |
| 5,321,645 | 6/1994 | Konstantinides et al. | 364/715.02 X |

*Primary Examiner*—Chuong Dinh Ngo
*Attorney, Agent, or Firm*—Wolf, Greenfield & Sacks P.C.

[57] ABSTRACT

A method and apparatus is shown for compressing a stream of data for storage, transmission or display while preserving maximum, minimum, and other valuable data features. The method and apparatus utilize a first and a second pair of error boundary lines to generate best fit trend segments of the data stream. The first and second pair of error boundary lines are modified as data samples of the data stream are received such that all of the data samples are either on one of the first and second pair of error boundary lines or in an area between the first and second pair of error boundary lines. The first and second pair of error boundary lines are then used to generate the best fit trend segments.

31 Claims, 6 Drawing Sheets

METHOD AND APPARATUS FOR DATA COMPRESSION

BACKGROUND OF THE INVENTION

1. Field of the Invention

The present invention relates generally to a method and apparatus for presenting and storing data, and more particularly to a method and apparatus for compressing a data stream for transmission, display or storage.

2. Discussion of the Related Art

Compression schemes and apparatus are known for providing compression of a stream of digital data to increase an effective transmission rate of the data and to increase an effective storage capacity of a storage device used for storing the data stream. These conventional digital data compression schemes are generally not designed for, and thus may not provide optimum compression of, data streams comprised of analog data or analog data converted to digital format.

Modern industrial process control is becoming increasingly computerized, and part of this development is the addition of electronic intelligence to process components. Valves, sensors, controllers and similar devices used in modern industrial process control systems broadcast information to electronic controllers which process and store this information. Typically, only portions of the information are relevant to plant operation, and the remainder of the information is either noise, or redundant.

The information generated by the process components is typically analog information in the form of an analog data stream having a particular value at a particular point in time. The analog data stream may be converted to a digital data stream using an analog to digital converter. It is usually desirable to store the data stream in a data storage apparatus and/or transmit the data stream over a data transmission system for processing of the information contained therein. Therefore, it is desirable to reduce the noise and redundancy in the data stream to prevent storage requirements for the data storage apparatus from being undesirably large and to prevent transmission bandwidth requirements of the data transmission system from also being undesirably large.

Commercial examples of analog data streams exhibiting the above-identified problem occur in the process control industry where industrial plants commonly run continuously. Sensors and transducers such as thermometers, pressure gauges and level monitors, typically generate analog signals over time. Recording all of the analog information generated from the sensors would require large storage systems; however, it is not generally necessary to store all of the information that is generated.

There are a variety of prior methods of addressing these issues, each of which has unsatisfactory or limiting aspects. The data streams discussed above are typically two-dimensional, having a value at a given time. For such two-dimensional data, the attributes of the data of interest are typically the current trend, maximum and minimum points over a given time period, maximum and minimum slopes, maximum and minimum variations from some average, integral values, and actual data points. It may also be important to know the amount of noise present in the data stream at a particular time.

Averaging is a method of reducing the data rate or data volume problem, though with some loss of information. In the most common method of averaging, a group of sequential values is combined and reduced to an average value. This process is actually a filtering process that results in the loss of actual data values including maximum and minimum values and creates a new, but false substitute point. Some noise is eliminated using this method, but so is the information about the amount of noise.

Another method used to filter data is to keep only points that differ by a minimal amount from a last stored point. This method still tends to store noise when there are frequent changes in the data. Still another method to filter data is to eliminate "deviant points," those that are not smoothly in line with others. This method reduces noise but it also eliminates real spikes along with the noise. Such filtering generally destroys the maximums mentioned above, but the remaining points are all true points.

As much data as necessary may be eliminated using filtering, but with a resulting loss of truth to the presentation.

Data compression is a method distinct from averaging or filtering. Data compression analyzes the data values or points of the data stream to abstract the critical aspects from the process data and store them in memory in a format requiring less memory than if every point of the original data stream were stored. Ideally, this abstraction results in more important points or other aspects of the data stream being extracted and less data being stored. Preferably, such an abstraction also aids in interpreting the data stream by preserving significant aspects of the data stream and showing clear trends in the data stream. A known compression method is disclosed in U.S. Pat. No. 4,669,097 issued to the inventor of the present invention and incorporated herein by reference. In the referenced patent, a Swinging Door Compression Method is disclosed for compressing a stream of analog data.

The Swinging Door compression method approximates a trend record of a stream of analog data using a sequence of optimum straight line approximations to successive segments of the data. The method computes the longest possible straight line through an initial point staying within predetermined error bounds to provide a trend of the data. The method utilizes an upper error boundary line and a lower error boundary line, designated as doors, that are used to contain the data within a zone between the doors. Each of the doors pivots about a respective offset point. The offset points are established by adding and subtracting an error value from an initial data point of a segment of data. Each door turns in one direction only. The upper door, initially pointing straight down, turns only counter clockwise, and the lower door, initially pointing straight up turns only clockwise. If a successive point is between the rotated doors, it is discarded. If it is outside a door, i.e., above the upper door or below the lower door, then that door is rotated to accommodate the point. In this way, the doors are progressively rotated to close upon an even longer, and yet more narrowly directed corridor that contains the current series of points. Once the doors have rotated so as to be parallel to each other, they are then not allowed to rotate further. The parallel doors, centered about a central trend line, then form a band or corridor that covers the data received to that point. As long as a subsequent data point falls within the boundary of the now parallel upper and lower doors, it is passed over.

The end of the current corridor is signaled by the receipt of a data point outside the corridor. A last point positioned between the parallel doors is recorded as representing the last point along the segment. In this way, only the first, and last signal points along the corridor or trend segment are recorded, and all the intermediate points are discarded. All the discarded points fall within the corridor defined by the parallel doors. The last point of the trend segment is used to establish two new pivot points above and below it by the offset or error bound. The above-described process is then repeated to establish a new trend segment.

The Swinging Door compression method provides substantial compression with minimum computation. However, the accuracy of the Swinging Door compression method is somewhat limited in that the pivot points of the doors are always at a fixed distance from an initial data point.

SUMMARY OF THE INVENTION

Embodiments of the present invention are directed to a method and apparatus for compressing an analog data signal into a series of best-fit trend line segments. Embodiments of the present invention overcome limitations of the prior art by utilizing a compression method having doors with pivot points that are not at a fixed distance from an initial data point.

In one embodiment of the present invention, a method for compressing a data stream defined by at least two components include steps of receiving first and second sample points of the data signal, generating a first pair and a second pair of error boundaries, each of the first pair and the second pair including an upper boundary and a lower boundary separated by a predetermined error value, receiving a next sample point of the data signal, discarding the next sample point when a value of the next sample point is greater than or equal to the lower boundary of the second pair of error boundaries and the value of the next sample point is less than or equal to the upper boundary of the first pair of error boundaries, recognizing a segment end condition when the value of the next sample point is greater than the upper boundary of the second pair of error boundaries or less than the lower boundary of the first pair error of boundaries, otherwise modifying at least one of the first and second pairs of error boundaries such that each boundary pair of the first pair and the second pair includes at least one of the previous sample points, such that for each one of the pair of error boundaries, all of the previous sample points are either between the upper boundary and the lower boundary of the one of the pair of error boundaries or are located on the upper boundary or the lower boundary, and generating a best fit line segment of the sample points received thereby reducing the amount of information required to represent the data signal.

In another embodiment of the present invention, a computer storage module includes instructions for operating a general purpose computer to compress a data stream having data samples including first and second data samples. The storage module comprises a first set of instructions executable by the computer to generate a first pair and a second pair of parallel error boundaries, each of the first pair and the second pair including an upper boundary and a lower boundary separated by a predetermined error value, a second set of instructions executable by the computer to discard a next data samples when the next data sample is between the lower boundary of the second pair of error boundaries and the upper boundary of the first pair of error boundaries, a third set of instructions executable by the computer to recognize a segment end condition when the next data sample lies outside an area between the upper boundary of the second pair of error boundaries and the lower boundary of the first pair of error boundaries, a fourth set of instructions executable by the computer to modify at least one of the first and second pairs of error boundaries such that each boundary of the first pair and the second pair of error boundaries includes at least one of the data samples and such that for each one of the pair of error boundaries all data samples received by the computer since the last segment end condition are either contained within an area between the upper boundary and the lower boundary of the one of the pairs of error boundaries or located on one of the upper boundary and the lower boundary, and a fifth set of instructions executable by the computer to generate a best fit line segment of all data samples of the data stream received by the computer since the last segment end condition thereby compressing segments of the data stream.

In another embodiment of the present invention, an apparatus compresses a data stream having a plurality of data samples into a series of best fit trend line segments. The apparatus includes means for receiving data samples of the plurality of data samples including a first data sample and a second data sample, means for generating a first pair and a second pair of parallel error boundaries, means for discarding data samples between the lower boundary of the second pair of error boundaries and the upper boundary of the first pair of error boundaries, means for modifying at least one of the first and second pairs of error boundaries such that each boundary of the first pair and the second pair of error boundaries includes at least one data sample received by the apparatus and such that for each one of the pair of error boundaries, all data samples of the plurality of data samples received by the apparatus since the last segment end condition are either contained between the upper boundary and the lower boundary or located on one of the upper boundary and the lower boundary, and means for generating a best fit line segment of data samples received by the means for receiving.

DESCRIPTION OF THE FIGURES

For a better understanding of the present invention, reference is made to the drawings, which are incorporated herein by reference and in which.

DETAILED DESCRIPTION

Figure 1:
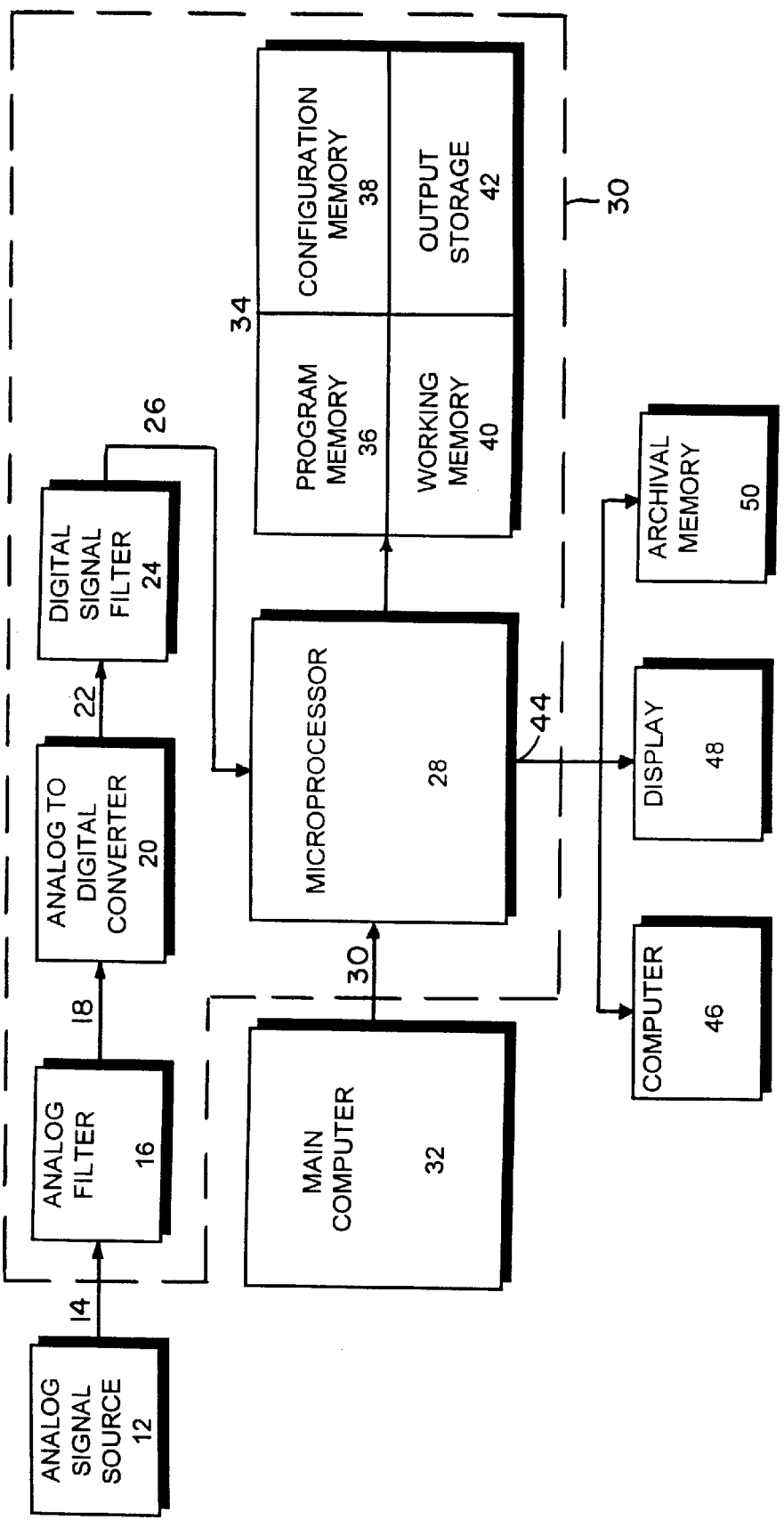
FIG. 1 is a block diagram of one embodiment of the present invention.

FIG. 1 shows a computer apparatus 30 that compresses an analog data stream in accordance with one embodiment of the present invention. The computer apparatus is coupled to an analog signal source 12. The analog signal source 12 may be, for example, a pressure sensor, flow meter or similar signal source that generates an analog signal representative of a measured value. The analog signal is transmitted from the analog signal source along line 14 to the computer apparatus 30. Within the computer apparatus, the analog signal is received by an analog filter 16 which removes electrical noise from the signal. A filtered analog signal is passed from the analog filter to an analog to digital converter 20 along a line 18. The analog to digital converter 20 samples the analog signal at discrete points in time, converts the analog signal to a corresponding digital signal (i.e., a sequence of digital sample values) and transmits the digital signal along a line 22 to a digital signal filter 24 where digital "chatter" is removed. The analog and digital filters are not required in the computer system but are contained therein in a preferred embodiment of the present invention to reduce noise and other artifacts in the signals. The analog filter 16, the analog to digital converter 20 and the digital signal filter 24 may alternatively be included in a stand-alone chassis external to the computer system 30 or may be contained within the analog signal source 12.

The filtered digital signal is passed over line 26 to a microprocessor 28. The filtered digital signal received by the microprocessor comprises a series of digital bits that are grouped to represent digital sample values of the original analog signal. The filtered digital signal may or may not include time values corresponding to the measured values. In one embodiment of the present invention, the digital sample values have a fixed time spacing that corresponds to a sample rate of the analog to digital converter 20. The microprocessor 28 or other circuitry may insert appropriate time values based on the fixed time spacing provided by the analog to digital converter 20.

The microprocessor 28 further receives control signals as inputs along a line 30 from an operator, or as depicted in FIG. 1, by a main computer 32 to control the overall operation of the microprocessor 28.

The microprocessor 28 is also coupled to a local memory 34. The local memory 34 is shown integral with the computer apparatus 30; however, in embodiments of the present invention, the memory 34 may be separate from the computer apparatus 30. The microprocessor 28 communicates with local memory 34 for storage and retrieval of: (1) the digital sample values received from line 26; (2) control and program data received from the main computer 32 over line 30; and (3) calculated and temporarily retained results of processing performed by the microprocessor 28.

In one embodiment of the present invention, the memory 34 is divided into a program memory 36, a configuration memory 38, a working memory 40 and an output memory 42 as shown in FIG. 1. The program memory 36 may be a read only memory (ROM). The program memory contains instructions for compressing the data received from the analog signal source 12. Configuration memory 38 includes identification attributes of a data stream being processed including, for example, name, units, scaling or similar attributes. The working data memory 40 may contain a section of incoming data received from the analog sensor 12 which is to be compressed. The output memory 42 contains compressed data which is stored within the output memory 42 prior to transmission external to the computer apparatus 30.

Microprocessor 28 compresses the received digital signal and stores a result of the compression in memory 34 until instructed, for example by the main computer 32, to transmit the data through an I/O port 44 to an external device such as a computer 46, a display 48 or an archival memory 50 as shown in FIG. 1. The main computer 32 may be executing instructions other than the instructions related to data compression. These instructions may be part of an operating system of the main computer 32 or an application program being executed by the main computer 32.

The compression method executed by the instructions stored in the program memory 36 is identified as a Rolling pivot, Swinging Door, Trend Compression Method. The method operates within the above-described apparatus to receive a digital data stream, compress the digital data stream, and generate an output stream of compressed data. The output stream of compressed data consists of best-fit line segments, identified as trend line segments, which provide an approximation of the input data stream. The Rolling pivot, Swinging Door Trend Compression Method is based on a concept that an approximation of a set of data points can be computed from the data points of a set that constitute only the boundary points (defined as vertex points) of the convex hull of trend data. A convex hull of a set of points is defined as the smallest convex set including all points of the set. The vertex points of the convex hull are the points that are left by drawing all lines between all points of the set of points and then deleting all interior lines and points. The vertex points include a first data point of the set of points and the latest received data point. As new data points are added to the set of points, the convex hull grows to include all added points. Upper boundary vertex points of the convex hull are defined as those vertex points encountered by following the perimeter of the convex hull in a counter-clockwise direction from the latest received vertex point to the first data point of the convex hull. Lower boundary vertex points of the convex hull are defined as those vertex points encountered by following the perimeter of the convex hull in a clockwise direction from the latest received vertex point to the first data point of the convex hull. Each subsequent convex hull includes all of the earlier convex hulls.

A general description of the Rolling Pivot, Swinging Door, Trend Compression Method in accordance with one embodiment of the present invention will now be provided with reference to FIGS. 2–9. A more detailed description of the compression method, including an example of the operation of the compression method on a sample data stream, follows the general description.

Figure 2:
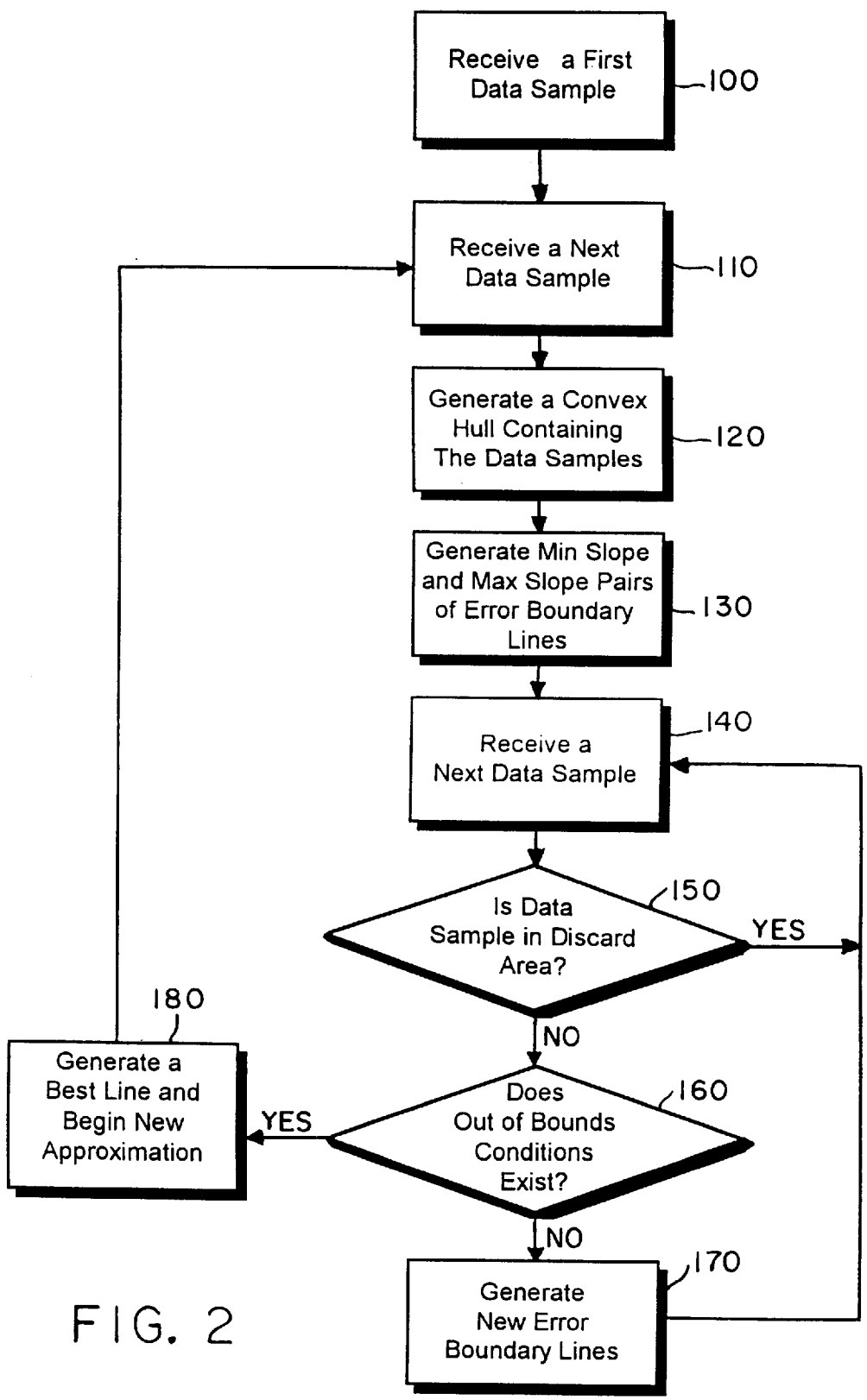
FIG. 2 is a flow chart of a method in accordance with one embodiment of the present invention.

FIG. 2 shows a flowchart of the Swinging Door Trend Compression Method in accordance with one embodiment of the present invention. In steps 100 and 110, first and second data samples of a digital signal are received. A convex hull of the data samples is created in step 120. Initially the convex hull consists of the line segment connecting the first and second data samples. In step 130, a first and a second pair of error boundary lines are created. Each of the first pair and the second pair of error boundary lines includes an upper line and a lower line. The procedure for generating the first and second pair of error boundary lines is discussed in more detail further below. The error boundary lines of each pair have the same slope and are separated by a vertical distance equal to twice a specified error limit (E). The error limit is selected based on a trade-off between compression efficiency and level of accuracy of the approximation. A greater error limit results in greater compression efficiency and a resulting loss of accuracy. For each trend line segment generated using the compression method, the error limit defines the maximum distance from the trend line segment of the data points of the data signal approximated by the trend line segment.

The slope of the first pair of error boundary lines is always less than or equal to the slope of the second pair of error boundary lines, and thus the first pair will be referred to as the min slope pair of error boundary lines and the second pair will be referred to as the max slope pair of error boundary lines.

Each line of the min slope pair and the max slope pair of error boundary lines includes at least one vertex point of the convex hull. A vertex point of the upper line of the min slope pair of error boundary lines is designated as the door vertex of the min slope pair, and a vertex point of the lower line of the min slope pair is designated as the pivot vertex of the min slope pair. Similarly, a vertex point of the upper line of the max slope pair of error boundary lines is designated as the pivot vertex of the max slope pair, and a vertex point of the lower line of the max slope pair is designated as the door vertex of the max slope pair. For either pair of error boundary lines, the pivot vertex corresponds to an earlier data point than the corresponding data point of the door vertex.

Figure 7A:
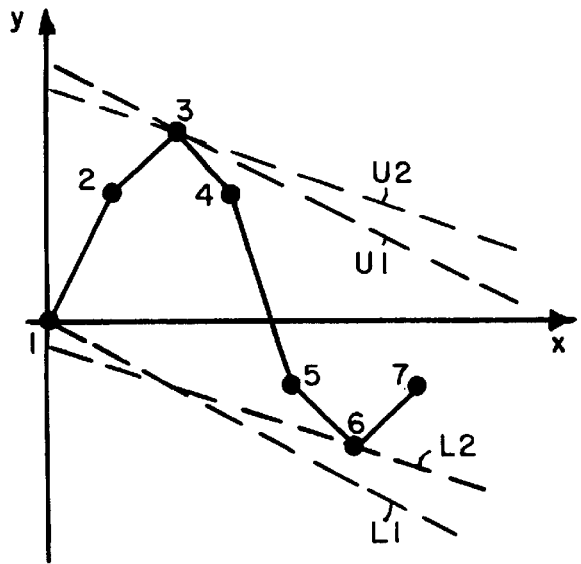
Figure 7B:
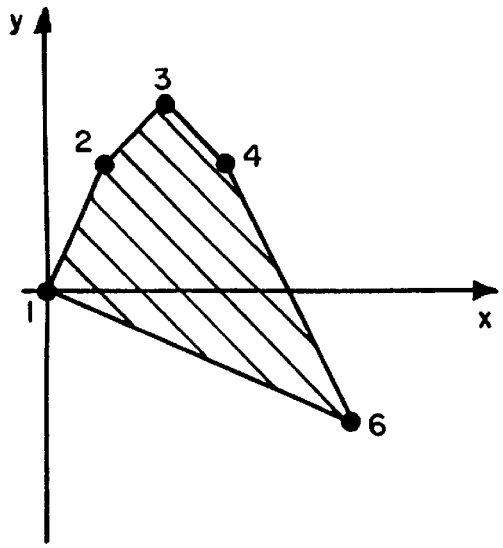

The next data sample of the data signal is received in step 140. In step 150, a determination is made of whether the next data sample received in step 140 is in a discard area between the upper line of the min slope pair of error boundary lines and the lower line of the max slope pair of error boundary lines. This determination corresponds to recognizing that the data falls between both pairs of boundary lines and will subsequently fall in the interior of the convex hull. FIG. 7(*a*) shows a graphical representation of the first seven data samples of a data signal, respectively labeled as 1, 2, 3, 4, 5, 6 and 7. Also shown in FIG. 7(*a*) are the min slope pair and the max slope pair of error boundary lines as they will appear after the receipt of the first six data samples. The upper and lower boundary lines of the min slope pair are respectively labeled as U1 and L1, and the upper and lower boundary lines of the max slope pair are respectively labeled as U2 and L2. The discard area lies between boundary lines U1 and L2. The next data sample (7) resides within this discard area, and the approximation determined by the boundary lines does not have to be modified to include the next data sample and the data sample is therefore discarded. When a data sample is discarded in step 150, the process returns to step 140 where the next data sample in the data signal is received.

When it is determined in step 150 that a data sample received in step 140 does not reside within the discard area, then a determination is made in step 160 as to whether an out of bounds condition exists. An out of bounds condition exists when a next data sample is outside an area defined by the upper error boundary line U2 of the max slope pair of error boundary lines and the lower error boundary line L1 of the min slope pair of error boundary lines for the prior data.

Figure 8A:
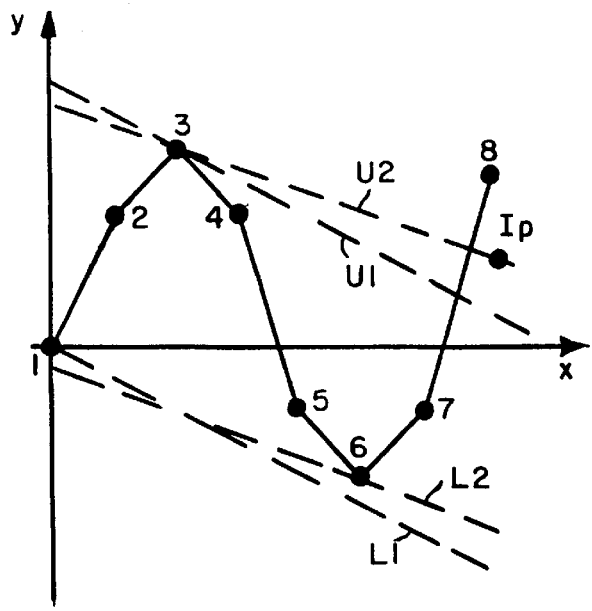
Figure 8B:
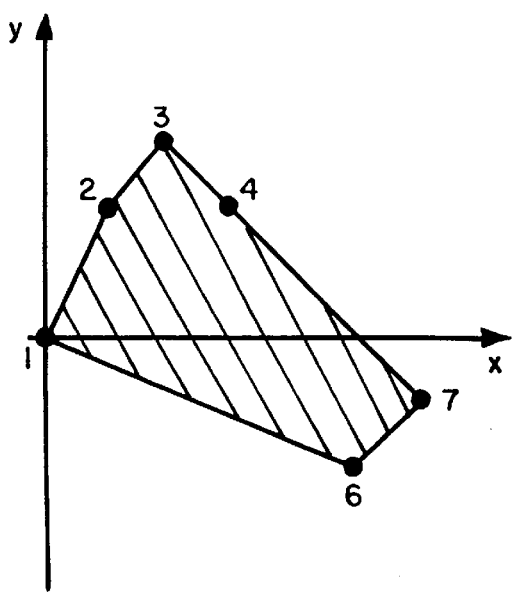

Data sample 8 of FIG. 8(*a*) is an example of an out of bounds data sample. When an out of bounds condition is determined, a line segment end is established and a best fit line of the data samples received since a last line segment end (except for the out of bounds data point) is generated (step 180). The out of bounds data sample is used as the first data sample in a next line segment approximation and the process described above is then repeated beginning with step 110.

When the result of the determination in step 160 is "NO", indicating that an out of bounds condition does not exist, then in step 170, a determination is made as to whether the min slope pair and the max slope pair of error boundary lines must rotate about the pivot points to include the next data sample within the "doors" (the min slope and max slope pairs of error boundary lines), and a determination is made as to whether one or both pivot points must roll to a new pivot point.

Figure 9:
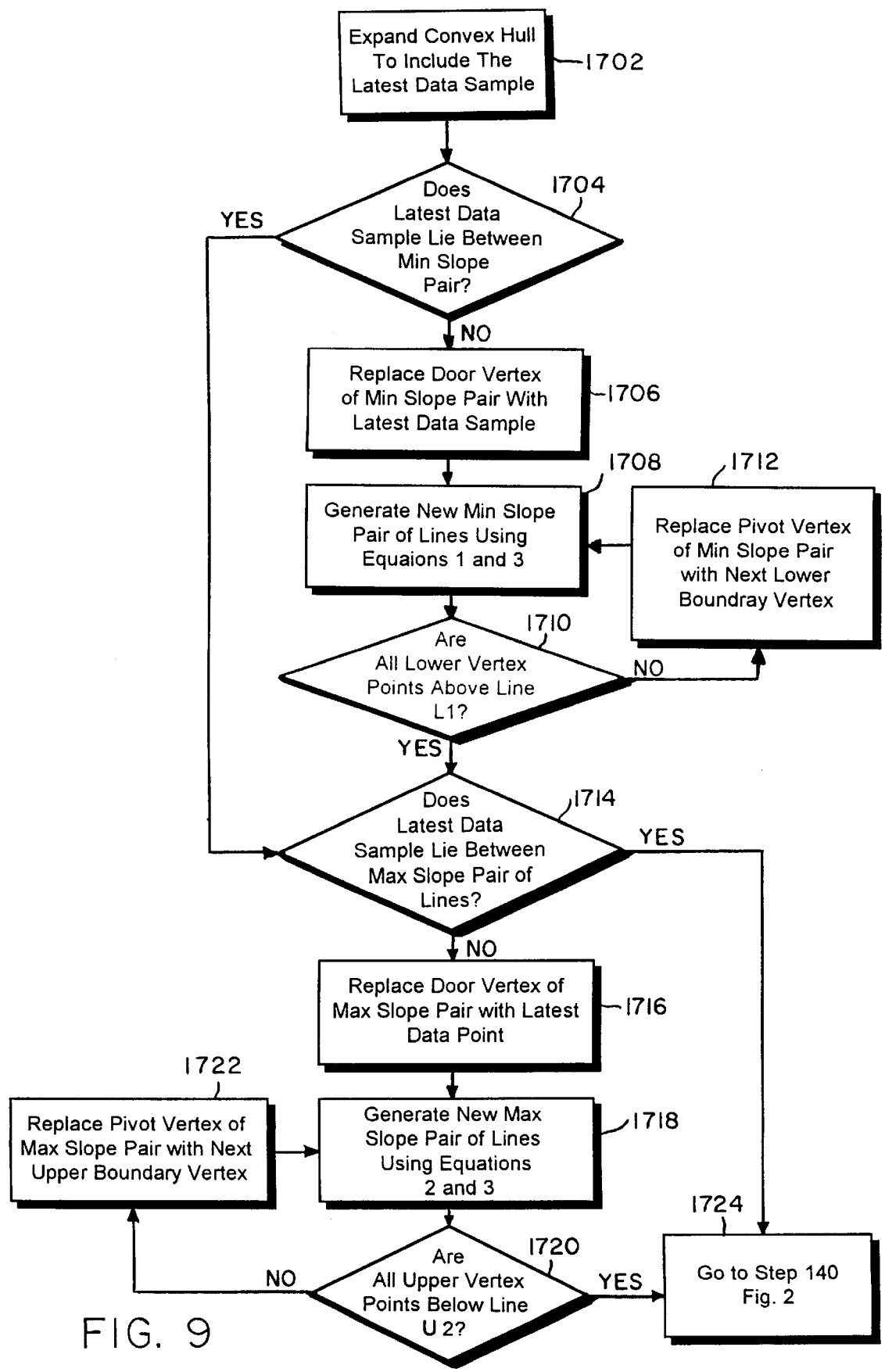
FIG. 9 is a flow chart showing a portion of the method of FIG. 2 in greater detail.

FIG. 9 shows a more detailed flow chart of the steps by which new error boundary lines are generated in step 170. In step 1702, the convex hull is expanded to include the latest data sample as a vertex point of the convex hull. A determination is then made in step 1704 as to whether the latest data sample lies in an area between the upper line U1 and the lower line L1 of the min slope pair of error boundary lines. If the result of this determination is "YES", the method proceeds to step 1714 and continues as described below. If the result of the determination in step 1704 is "NO", then the door vertex of the min slope pair of error boundary lines is replaced with the latest data sample.

A new min slope pair of error boundary lines is then calculated in step 1708 using equations (i) and (iii) (these equations are provided below and discussed in greater detail therein). In step 1708, the min slope pair of error boundary lines essentially pivots about the pivot vertex of the min slope pair of error boundary lines to include the new vertex point. A determination is then made in step 1710 as to whether all vertex points of the lower boundary of the convex hull lie above the line L1 generated in step 1708. If any of the lower boundary vertex points lie below line L1, then it is necessary to roll the pivot point from the existing pivot point to the next lower boundary vertex point adjacent the pivot point. This is accomplished in step 1712. Steps 1708, 1710 and 1712 are repeated until the result of step 1710 is "YES".

Once step 1714 is reached, the latest data sample will lie between the min slope pair of error boundary lines. In step 1714, a determination is then made as to whether the latest data sample lies between the max slope pair of error boundary lines. Note that if the result of step 1704 is "YES", then the result of step 1714 must be "NO", otherwise, the latest data sample lies within the previously described discard area or is out of bounds, and the method would not have reached step 170. Steps 1714 through 1722 are similar to steps 1704 through 1712 described above, except that they are used to generate a new max slope pair of error boundary lines rather than a new min slope pair of error boundary lines. When the result of step 1720 is "YES", then the approximation method continues at step 140 (FIG. 2) with the receipt of another data sample.

Upon creation of the new error boundary lines, the process returns to step 140 where the next data sample is received. Using the above described process, a data signal comprised of a set of data samples can be substantially compressed and may be stored as a series of trend line segments that approximate the set of data samples with an approximation error equal to the specified error E.

The operation of the Rolling pivot, Swinging Door Compression Method in accordance with one embodiment of the present invention is described in detail below with reference to an exemplary data signal as shown in FIGS. 3–8. The description of the method is made easier with the establishment of some naming conventions. Incoming data samples D(i) of a data signal will be referenced in numerical sequence (1, 2, 3 . . . i). Vertical data values of incoming data samples will be referred to as D(i)y and horizontal values, corresponding to time, will be referred to as D(i)x. As discussed above, in the summary of the method, upper and lower boundary lines of a first pair (referred to as the min slope pair) of boundary lines are respectively identified as U1 and L1 and upper and lower boundary lines of a second pair (referred to as the max slope pair) of error boundary lines are respectively identified as U2 and L2.

FIGS. 3–8 show an example of an analog signal that has been sampled and digitized and is displayed as a single series of data samples on a graph. Each of the data samples corresponds to a sample value of the analog signal at a specific point in time. The data samples are spaced at fixed intervals determined by the sample rate of the analog to digital converter 20. In FIGS. 3–8, the "a" version of the Figures shows the progression of the error boundary lines as additional points are received, while the "b" version of the Figures shows the progression of the convex hull as additional data points are received. Table 1 shows the values of the first eight data samples of the data stream.

TABLE 1

| D(i)x | D(i)y |
|---|---|
| 1 | 0 |
| 2 | 2 |
| 3 | 3 |
| 4 | 2 |
| 5 | −1 |
| 6 | −2 |
| 7 | −1 |
| 8 | 3 |

Figure 3A:
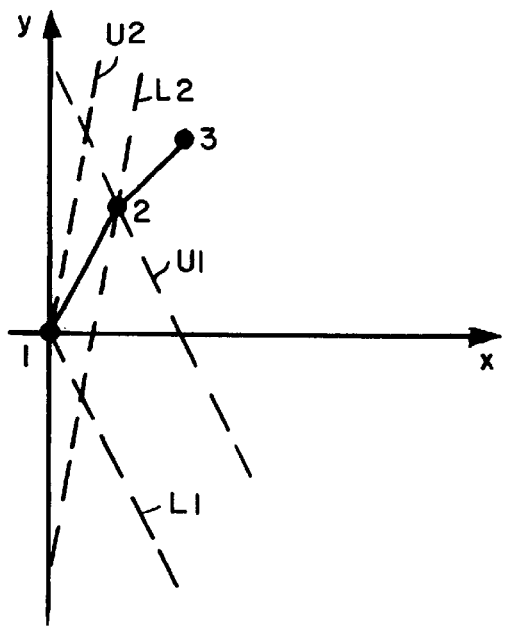
FIGS. 3(a), 3(b), 4(a), 4(b), 5(a), 5(b), 6(a), 6(b), 7(a), 7(b), 8(a) and 8(b), are diagrams showing an operation of one embodiment of the present invention.

The first three data samples (numbers 1, 2 and 3) of the series are shown on the graph in FIG. 3(a) along with the min slope pair (U1 and L1) and the max slope pair (U2 and L2) of error boundary lines as they exist after the receipt of the first two data samples (after steps 100 and 110 of FIG. 2). The pivot vertex for each pair of error boundary lines corresponds to the first data sample 1 and the door vertex for each pair of error boundary lines corresponds to the second data sample 2. The slopes of the min slope pair and the max slope pair of error boundary lines are calculated respectively using equations (i) and (ii).

$$s_1 = \frac{(y_{d1} - y_{p1}) - 2 \cdot E}{(x_{d1} - x_{p1})} \quad \text{(i)}$$

$$s_2 = \frac{(y_{d2} - y_{p2}) + 2 \cdot E}{(x_{d2} - x_{p2})} \quad \text{(ii)}$$

where: E=the specified error value;
$y_{d1}$=the y value of the door vertex of the min slope pair;
$y_{p1}$=the y value of the pivot vertex of the min slope pair;
$x_{d1}$=the x value of the door vertex of the min slope pair;
$x_{p1}$=the x value of the pivot vertex of the min slope pair,
$y_{d2}$=the y value of the door vertex of the max slope pair;
$y_{p2}$=the y value of the pivot vertex of the max slope pair;
$x_{d2}$=the x value of the door vertex of the max slope pair;
$x_{p2}$=the x value of the pivot vertex of the max slope pair,
$s_1$=the slope of the min slope pair of error boundary lines; and
$s_2$=the slope of the max slope pair of error boundary lines.

The specified error value E for the example shown in FIGS. 3–8 has been set equal to 2. The equation defining each of the error boundary lines is determined using equation (iii).

$$y - y_v = s \cdot (x - x_v) \quad \text{(iii)}$$

where:
s=the slope of the error boundary line (either $s_1$ or $s_2$ calculated above);
$y_v$=the y value of the vertex point of the boundary line; and
$x_v$=the x value of the vertex point of the boundary line.

Figure 4A:
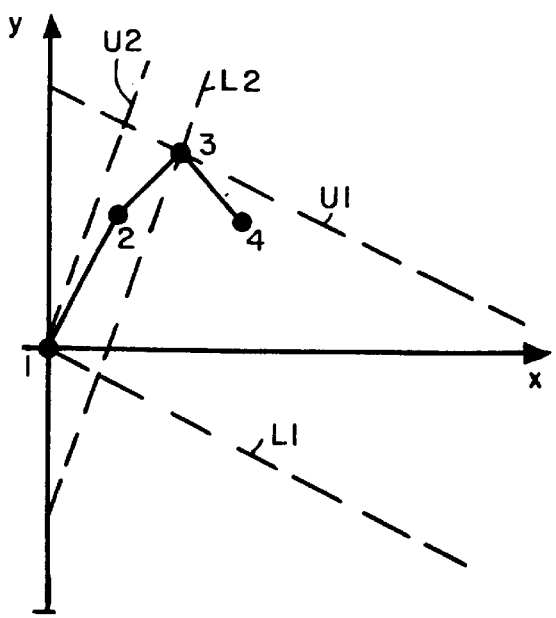

The next step in the approximation is to receive a next data sample as described in step 140 of FIG. 2 and shown graphically in FIGS. 3(a) and 4(a) as data sample 3. A determination is then made as to whether the third data sample lies within a discard area, defined as the area below boundary line U1 and above boundary line L2. In the approximation shown in FIG. 3(a), only three data samples have been received thus far and the min slope and max slope pairs of error boundary lines have not rotated sufficiently to define a discard area. Thus, the result of executing decision block 150 is "NO" and the method proceeds to decision block 160 where a determination is made as to whether an out of bounds condition exists. As indicated previously, an out of bounds condition exists when a next data sample is outside an area defined by the lower error boundary line L1 of the min slope pair and the upper error boundary line U2 of the max slope pair. An out of bounds condition does not exist with respect to the third data sample, and the approximation method continues with step 170 in which either one or both of the min slope pair and the max slope pair of error boundary lines are replaced with new error boundary lines.

Figure 3B:
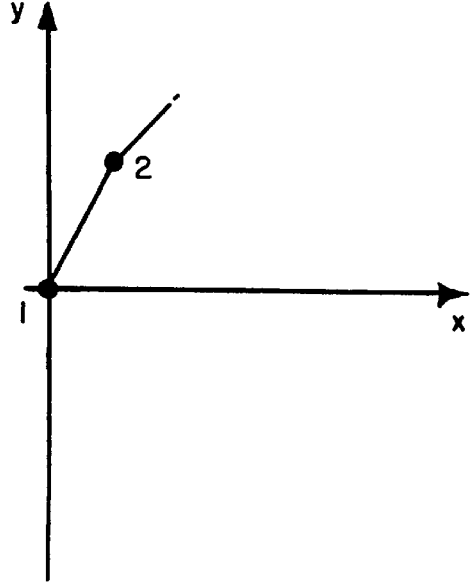

The method for generating new error boundary lines is shown in FIG. 9. At step 1702 the convex hull is expanded to include the latest data sample. The convex hull after the receipt of the second data point consists of the segment connecting data samples 1 and 2 as shown in FIG. 3(b). At step 1704 a determination is made as to whether data sample 3 lies between the min slope pair of error boundary lines. As shown in FIG. 3(a), data sample 3 does not lie between the min slope pair or the max slope pair of error boundary lines. Therefore, the door vertex of the min slope pair of lines is replaced with data sample 3 (step 1706), and a new min slope pair of error boundary lines is generated using equations (i) and (iii) (step 1708). The new min slope pair of error boundary lines is shown as U1 and L1 in FIG. 4(a). A determination is then made as to whether all lower boundary vertex points are above line L1 in FIG. 4(a) (step 1710). This determination is made using equation (iv)

$$\Delta y (y_n - y_{p1}) - s_1 \cdot (x_n - x_{p1}) \quad \text{(iv)}$$

where:
$\Delta y$=the vertical distance between the nth vertex point and boundary line L1;
$y_n$=the y value of the nth vertex point;
$y_{p1}$=the y value of the pivot vertex of the min slope pair;
$x_n$=the x value of the nth vertex point;
$x_{p1}$=the x value of the pivot vertex of the min slope pair; and
$s_1$=the slope of the min slope pair of error boundary lines.

A negative value of $\Delta y$ in equation (iv) indicates that the nth lower boundary vertex point is below line L1, and therefore, the pivot point must roll to the next lower boundary vertex point. Equation (iv) is repeated for each of the lower boundary vertex points.

The result of decision block 1710 after receipt of data sample 3 is "YES" since data sample 1 is the only lower boundary vertex point of the convex hull at this point in the approximation.

The result of decision block 1714 is "NO" as the third data sample does not lie between lines U2 and L2 in FIG. 3(a), and thus a new max slope pair of error boundary lines must be generated using steps 1716 through steps 1722. Steps 1716 and 1718 are similar to steps 1706 and 1708, described above.

At step 1720, a determination is made as to whether all upper boundary vertex points are below line U2 in FIG. 4(a). This determination is similar to that made at step 1720 and is accomplished using equation (v).

$$\Delta y = (y_n - y_{p2}) - s_2 \cdot (x_n - x_{p2}) \quad \text{(v)}$$

where:
$\Delta y$=the vertical distance between the nth vertex point and boundary line U2;

$y_n$=the y value of the nth vertex point;
$y_{p2}$ =the y value of the pivot vertex of the max slope pair;
$x_n$=the x value of the nth vertex point;
$x_{p2}$ =the x value of the pivot vertex of the max slope pair; and
$s_2$=the slope of the max slope pair of error boundary lines.

A positive value of $\Delta y$ in equation (v) indicates that the nth lower boundary vertex point is above line U2, and therefore, the pivot point must roll to the next upper boundary vertex point. Equation (v) is repeated for each of the upper boundary vertex points.

Figure 4B:
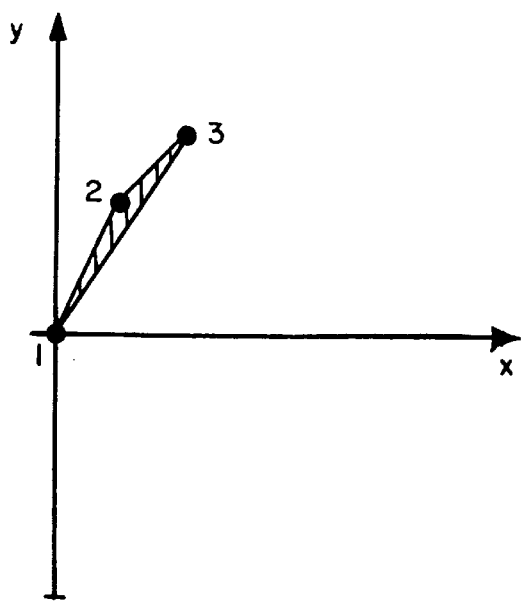

The result of decision block 1720 is "YES" since data sample 2, the only upper boundary vertex point other than the pivot point (data sample 1), is below line U2 as shown in FIG. 4(*a*). The resulting new max slope pair of error boundary lines is shown as lines U2 and L2 in FIG. 4(*a*). FIG. 4(*b*) shows the expansion of the convex hull to include data sample 3.

The fourth data sample is shown in FIG. 4(*a*) along with the error boundary lines as they exist after the receipt of the first three data samples. The compression method proceeds with steps 150 through 170. As shown in FIG. 4(*a*), data sample 4 lies between the min slope pair of error boundary lines (U1 and L1), and therefore, a new min slope pair of error boundary lines is not needed. However, data sample 4 does not lie between the max slope pair of error boundary lines (U2 and L2), and therefore, a new max slope pair of error boundary lines is needed. The max slope pair of error boundary lines is created using steps 1714 through 1722 as described above. The upper U2 and lower L2 lines of the resulting new max slope pair of error boundary lines are shown in FIG. 5(*a*) along with the upper U1 and lower L1 error boundary lines of the min slope pair.

Figure 5A:
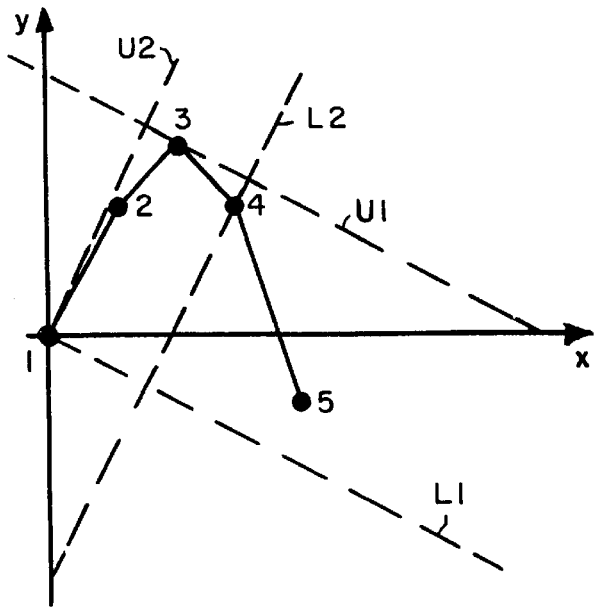
Figure 5B:
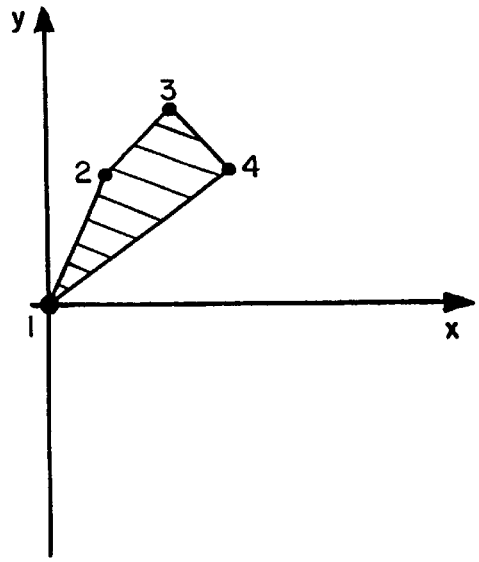
Figure 6A:
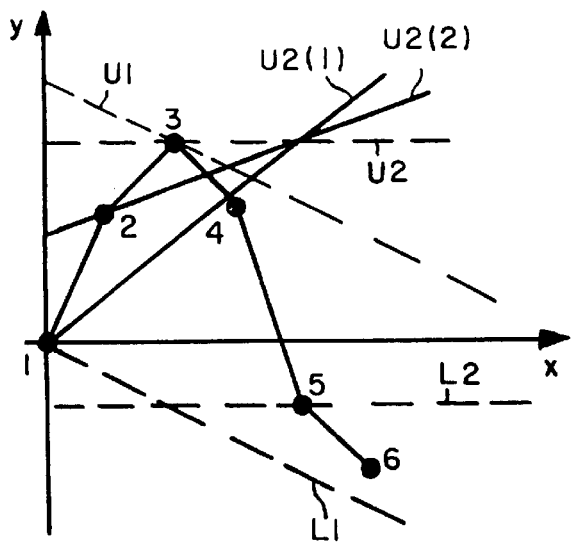
Figure 6B:
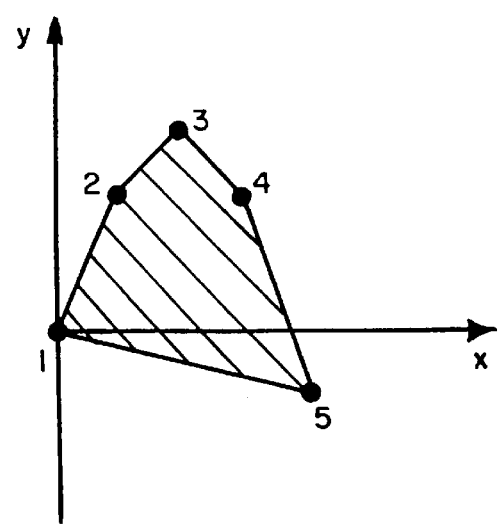

The fifth data sample is shown in FIG. 5(*a*) along with the error boundary lines as they exist after the receipt of the first four data samples. FIG. 5(*b*) shows the expansion of the convex hull to include the fourth data sample. Data sample 5 lies between the min slope pair of error boundary lines (U1 and L1), and therefore, a new min slope pair of error boundary lines is not needed. However, data sample 5 does not lie between the max slope pair of error boundary lines (U2 and L2), and therefore, a new max slope pair of error boundary lines is needed. The max slope pair of error boundary lines is created using steps 1714 through 1722 as described above. At step 1720 a determination is made, using equation (v), as to whether all upper vertex points lie below the upper line U2 of the max slope pair. For data sample 5, all upper vertex points do not lie below the initial upper line generated using equations (ii) and (iii), and thus the result of decision block 1720 is initially "NO". The initial upper line U2 (1) is shown in FIG. 6(*a*). Upper boundary vertex points 2 and 3 are above line U2(1), and thus the pivot point for the second pair of error boundary lines must be changed from data sample 1 to data sample 2 (step 1722).

Steps 1718 and 1720 are then repeated using data sample 2 as the pivot point in equation (ii). The upper error boundary line U2(2) created using data sample 2 as the pivot point still does not satisfy the condition of decision block 1720. As shown in FIG. 6(*a*) data sample 3 lies above the upper error boundary line U2(2), and thus the pivot point for the max slope pair of error boundary lines must be changed from data sample 2 to data sample 3 (step 1722). Steps 1718 and 1720 are then repeated using data sample 3 as the pivot point in equation (ii). The upper error boundary line U2 created using data sample 3 as the pivot point satisfies the condition of decision block 1720, and the upper U2 and lower L2 lines of the resulting new max slope pair of error boundary lines are shown in FIG. 6(*a*) along with the upper U1 and lower L1 error boundary lines of the min slope pair.

The sixth data sample is shown in FIG. 6(*a*) along with the error boundary lines as they exist after the receipt of the first five data samples. FIG. 6(*b*)shows the expansion of the convex hull to include the fifth data sample. Data sample 6 lies between the min slope pair of error boundary lines (U1 and L1), and therefore, a new min slope pair of error boundary lines is not needed. However, data sample 6 does not lie between the max slope pair of error boundary lines (U2 and L2), and therefore, a new max slope pair of error boundary lines is needed. The max slope pair of error boundary lines is created using steps 1714 through 1722 as described above. The upper U2 and lower L2 lines of the resulting new max slope pair of error boundary lines are shown in FIG. 7(*a*) along with the upper U1 and lower L1 error boundary lines of the min slope pair.

The seventh data sample is shown in FIG. 7(*a*) along with the error boundary lines as they exist after the receipt of the first six data samples. FIG. 7(*b*) shows the expansion of the convex hull to include the sixth data point. As shown in FIG. 7(*b*), data sample 5 now lies within the interior of the convex hull and may be discarded. Data sample 7 lies between the min slope pair of error boundary lines and the max slope pair of error boundary lines and will be discarded in step 150 (FIG. 2). FIG. 8(*b*) shows the expansion of the convex hull to include the seventh data sample.

The method described above will continue until an out of bounds condition occurs (step 160). In the example shown in FIG. 8(*a*), data sample 8 is above the upper line U2 of the max slope pair of error boundary lines, and is therefore an out of bounds data sample. Upon the occurrence of an out of bounds condition, a best fit line of the data samples, including all of the data samples, except for the data sample that caused the out of bounds condition, is generated. Ideally, an out of bounds condition occurs after the min slope pair of error boundary lines and the max slope pair of error boundary lines have each rotated sufficiently such that the max slope pair of lines is equal to the min slope pair of lines. In this ideal situation, the best fit line segment through the data samples is the line segment comprising all data samples that are a vertical distance equal to the error distance from the upper line of each pair of error boundary lines and the lower line of each pair of error boundary lines.

More typically, when the segment end condition occurs, the lines of the min slope pair of error boundary lines will not be equal to the max slope pair of error boundary lines. In this situation, in one embodiment of the present invention, the pair of error boundary lines having the error boundary line closest to the out of bounds data point is used to generate the best fit line segment. In FIG. 8(*a*), the line closest to data sample 8 is the upper boundary line of the max slope pair of error boundary lines, and thus the max slope pair of error boundary lines is used to generate the best fit trend segment of data samples 1 through 7.

The point on the error boundary line corresponding to the x value of the out of bounds data sample is defined as the interpolation point and is shown as Ip in FIG. 8(*a*). The interpolation point can be calculated as follows. The nearest error boundary line to the out of bounds data sample D(i) will be either the upper line U2 of the max slope pair of error boundary lines or the lower line L1 of the min slope pair of error boundary lines. The value of y, D(i)y, for either line U2 or L1 at the value of x, D(i)x, of the out of bounds data sample D(i) is calculated using equation (iii) and substituting D(i)x for the value of x and the previously calculated slopes of either U2 or L1 from equations (i) and (ii). In an alternate embodiment of the present invention the interpolation point may have an x value intermediate the x value of the out of bounds data point (data sample 8) and the x value of the last data sample within the approximation (data sample 7).

The Swinging Door Compression Method of U.S. Pat. No. 4,669,097, referred to above, stores a single point per line segment (and one or more overhead bit codes), corresponding to the first point of the trend line segment, for each trend line segment of data. The last point of each trend line segment corresponds to the first point of the next segment, and thus each segment can be recreated by using the first point of the segment and the first point of the next segment.

In embodiments of the compression method described above, information additional to that stored using the Swinging Door Compression Method must be stored for each trend line segment as adjacent trend line segments are not continuous as in the Swinging Door Compression Method. In one embodiment of the present invention, for each trend line segment, the data stored to represent the trend line segment includes: the position of the interpolation point; an indication of whether the interpolation point lies on the min slope pair or the max slope pair of error boundary lines (this may be represented using one bit); and a vertical distance from the interpolation point of the preceding segment to the error boundary line of the present segment containing the interpolation point of the present segment.

The stored value used to represent a time value of a data stream being compressed can impact significantly the compression efficiency of compression methods in accordance with embodiments of the present invention. For example, for a data stream sampled at time intervals of one-tenth of one second for a period of ten years, the largest time value would be 3,153,600,000 (equal to 10 years×365 days/year×24 hours/day×3600 seconds/hour×10 samples/second) In one embodiment of the present invention, time is stored incrementally from a previous time value. For example, for a sample rate of 10 samples/second, 1 byte of data may represent a time interval of approximately 30 seconds and 2 bytes of data may represent an interval of approximately two hours. The actual number of bytes selected to represent a time interval can be determined based on the expected variability of the data stream being compressed. If a compressed segment of data exceeds the time interval supported by the number of bytes used to represent an interval of data, then an additional sample value may be added to the data stream.

In a preferred embodiment of the present invention, one or more variant strategies is included within the compression method to achieve maximum compression and accuracy depending on characteristics of the data stream. For example, the value selected for the error E (which as described above is equal to half the vertical distance between each line of a pair of error boundary lines) may be automatically adaptive to changes in characteristics of the data stream to optimize compression efficiency while controlling the amount of acceptable error.

In embodiments of a compression method and apparatus in accordance with the present invention, a relatively significant amount of temporary storage space may be required to store the vertex points of the convex hull. As described above, the vertex points are stored temporarily in case it becomes necessary during the generation of a best fit line segment to roll a pivot point to the next boundary vertex point on the convex hull.

In one embodiment of the present invention, the number of vertex points temporarily stored is reduced by bringing new data samples into the convex hull only when the addition of the new data sample in the convex hull will increase the perpendicular distance between the lines of one of the pair of error boundary lines by a factor equal to $\rho \times E$. The perpendicular distance is used as a measure of the degree of rotation of the error boundary lines, as the perpendicular distance will increase in proportion to the degree of rotation. The value of $\rho$ may be defined based on characteristics of the data, and based on the acceptable error for a given application. In a preferred embodiment of the present invention, $\rho$ is set for a value of 0.2. By limiting the number of data samples in the convex hull, the storage requirements of the system may be reduced. However, as a result, some data may be missed or bypassed, possibly causing the error of a trend line segment to exceed the set error value E by a value of $\rho \times E$.

In embodiments of the present invention, the Rolling pivot, Swinging Door Trend compression method may be combined with other known compression schemes to achieve greater compression of a stream of data. In one such embodiment, the compressed data may include codes indicative of characteristics of the data to facilitate further compression. These codes may include housekeeping data, periodical absolute time references, changes in scale, or codes facilitating segment search.

Having thus described at least one illustrative embodiment of the invention, various alterations, modifications and improvements will readily occur to those skilled in the art. Such alterations, modifications, and improvements are intended to be within the scope and spirit of the invention. Accordingly, the foregoing description is by way of example only and is not intended as limiting. The invention's limit is defined only in the claims and in the equivalents thereto.

I claim:

1. A method for compressing a data stream representative of measured values by a transducer having data samples with at least first and second degrees of freedom, the method comprising the steps of:

(A) receiving first and second data samples of the data stream from the transducer;

(B) generating a first pair and a second pair of error boundaries, each of the first pair and the second pair including an upper boundary and a lower boundary separated by a predetermined error value, wherein the upper boundary of the first pair includes the second data sample, the lower boundary of the first pair includes the first data sample, the upper boundary of the second pair includes the first data sample, and the lower boundary of the second pair includes the second data sample;

(C) receiving a next data sample of the data stream from the transducer;

(D) discarding the next data sample and repeating step (C) when a value of the next data sample is greater than the lower boundary of the second pair of error boundaries and is less than the upper boundary of the first pair of error boundaries;

(E) recognizing a segment end condition when the value of the next data sample is greater than the upper boundary of the second pair of error boundaries or the value of the next data sample is less than the lower boundary of the first pair of error boundaries;

(F) if a segment end condition does not exist:
   i) modifying at least one of the first and second pairs of error boundaries such that each boundary of the first pair and the second pair of error boundaries includes at least one previous data sample and such that for each one of the pair of error boundaries, all previous data samples are either contained within an area between the upper boundary and the lower boundary of the one of the pair of error boundaries or are located on one of the upper boundary and the lower boundary of the one of the pair of error boundaries;

ii) continuing from step (C); and (G) if a segment end condition does exist, generating a best fit line segment of the data samples received in steps (A) and (C) thereby compressing a segment of the data stream.

2. The method of claim 1, wherein the step of modifying at least one of the first and second pairs of error boundaries includes steps of:

generating a convex hull defining an area, the convex hull having vertex points corresponding to the next data sample and at least two data samples received previous to the next data sample, the area of the convex hull and the vertex points including the next data sample and all previous data samples of the data stream;

modifying the first pair of error boundaries such that the upper boundary of the first pair includes the next data sample, the lower boundary of the first pair includes a first lower vertex point of the vertex points, and the upper boundary and lower boundary of the first pair are separated by the predetermined error value.

3. The method of claim 2, wherein the step of modifying further includes steps of:

determining whether a value of any one of the vertex points of the convex hull is less than the lower boundary of the first pair of error boundaries; and if the value of any of the vertex points is less than the lower boundary of the first pair, adjusting the upper boundary and the lower boundary such that the upper boundary of the first pair includes the next data sample, the lower boundary of the first pair includes a second lower vertex point of the vertex points, and the upper boundary and the lower boundary of the first pair are separated by the predetermined error value.

4. The method of claim 3, wherein the step of modifying further includes a step of:

adjusting the second pair of error boundaries such that the lower boundary of the second pair includes the next data sample, the upper boundary of the second pair includes a first upper vertex point of the vertex points, and the upper boundary and the lower boundary of the second pair are separated by the predetermined error value.

5. The method of claim 4, wherein the step of modifying further includes steps of:

determining whether the value of any one of the vertex points of the convex hull is greater than the upper boundary of the second pair of error boundaries; and if the value of any of the vertex points is greater than the upper boundary of the second pair, adjusting the upper boundary and the lower boundary of the second pair such that the lower boundary of the second pair includes the next data sample, the upper boundary of the second pair includes a second upper vertex point of the vertex points, and the upper boundary and the lower boundary of the second pair are separated by the predetermined error value.

6. The method of claim 5, wherein step (G) includes steps of:

determining whether the first pair of error boundaries is equivalent to the second pair of error boundaries;

if the first pair is equivalent to the second pair, generating a best fit line segment, wherein the best fit line segment is equal to a set of points equidistant from the upper boundary and the lower boundary of the first pair of error boundaries;

if the first pair is not equivalent to the second pair:

i) selecting an interpolation data point to replace the next data sample, the interpolation data point being selected such that a modification of at least one of the first pair and the second pair of error boundaries to include the interpolation point, results in the first pair of error boundaries being equivalent to the second pair of error boundaries; and ii) generating a best fit line segment, wherein the best fit line segment is equal to a set of points equidistant from the upper boundary and the lower boundary of the first pair of error boundaries.

7. The method of claim 6, further comprising a step of: storing data representative of the best fit line segment.

8. The method of claim 7, wherein the data representative of the best fit line segment includes: a data point of one of the first and second pair of error boundaries; an indication of whether the data point is a data point of the upper boundary or the lower boundary of the one of the first pair and the second pair of error boundaries; and a distance from the best fit line segment to a previous best fit line segment.

9. The method of claim 8, wherein step (F) includes a step of:

modifying the at least one of the first and second pairs of error boundaries only when a distance from the upper boundary to the lower boundary of the at least one of the first and second pairs of error boundaries increases by a predetermined factor as a result of the modification.

10. The method of claim 1, wherein step (G) includes steps of:

determining whether the first pair of error boundaries is equivalent to the second pair of error boundaries;

if the first pair is equivalent to the second pair, generating a best fit line segment, wherein the best fit line segment is equal to a set of points equidistant from the upper boundary and the lower boundary of the first pair of error boundaries;

if the first pair is not equivalent to the second pair:

i) selecting an interpolation data point to replace the next data sample, the interpolation data point being selected such that a modification of at least one of the first pair and the second pair of error boundaries to include the interpolation point, results in the first pair of error boundaries being equivalent to the second pair of error boundaries; and ii) generating a best fit line segment, wherein the best fit line segment is equal to the set of points equidistant from the upper boundary and the lower boundary of the first pair of error boundaries.

11. The method of claim 1, further comprising a step of: storing data representative of the best fit line segment.

12. The method of claim 1, further comprising a step of: transmitting data representative of the best fit line segment.

13. The method of claim 12, wherein the data representative of the best fit line segment includes: a data point of one of the first and second pair of error boundaries; an indication of whether the data point is a data point of the upper boundary or the lower boundary of the one of the first pair and the second pair of error boundaries; and a distance from the best fit segment to a previous best fit line segment.

14. The method of claim 1, wherein step (F) includes a step of:

modifying the at least one of the first and second pairs of error boundaries only when a distance from the upper boundary to the lower boundary of the at least one of the first and second pairs of error boundaries increases by a predetermined factor as a result of the modification.

15. A computer storage module incorporating stored instructions for execution on a general purpose computer to compress a data stream having data samples including first and second data samples having first and second degree of freedom, the general purpose computer having an input to receive the data samples of the data stream and an output to provide an output signal representative of best fit line segments of the data stream, the storage module comprising:

a first set of instructions executable by the computer to generate a first pair and a second pair of boundaries, each of the first pair and the second pair including an upper boundary and a lower boundary separated by a predetermined error value, wherein the upper boundary of the first pair includes the second data sample, the lower boundary of the first pair includes the first data sample, the upper boundary of the second pair includes the first data sample, and the lower boundary of the second pair includes the second data sample;

a second set of instructions executable by the computer to discard a next data sample when a value of the next data sample is greater than the lower boundary of the second pair of error boundaries and less than the upper boundary of the first pair of error boundaries;

a third set of instructions executable by the computer to recognize a segment end condition when the value of the next data sample is greater than the upper boundary of the second pair of error boundaries or the value of the next data sample is less than the lower boundary of the first pair of error boundaries;

a fourth set of instructions executable by the computer, if a segment end condition does not exist, to modify at least one of the first and second pairs of error boundaries such that each boundary of the first pair and the second pair of error boundaries includes at least one of the data samples and such that for each one of the pair of error boundaries, a value of each data sample received by the computer since a last segment end condition is not greater than the upper boundary and not less than the lower boundary of the one of the pair of error boundaries; and a fifth set of instructions executable by the computer to, if a segment end condition does exist, generate a best fit line segment of all data samples of the data stream received by the computer since a last segment end condition and prior to the segment end condition thereby compressing segments of the data stream.

16. The computer storage module of claim 15, wherein the fourth set of instructions further includes instructions executable by the computer to:

generate a convex hull defining an area, the convex hull having vertex points corresponding to the next data sample and at least two data samples received by the computer before the next data sample, the area of the convex hull and the vertex points including the next data sample and all data samples received by the computer since the last segment condition; and adjust the first pair of error boundaries such that the value of the next data sample is not greater than the upper boundary of the first pair and the value of the next data sample is not less than the lower boundary of the first pair, the upper boundary and the lower boundary of the first pair are separated by the predetermined error value, and the lower boundary of the first pair includes a first lower vertex point of the vertex points.

17. The computer storage module of claim 16, wherein the fourth set of instructions further includes instructions executable by the computer to:

determine whether a value of any one of the vertex points of the convex hull is less than the lower boundary of the first pair of error boundaries; and if the value of any one of the vertex points is less than the lower boundary of the first pair, adjust the upper boundary and the lower boundary such that the upper boundary of the first pair includes the next data sample, the lower boundary of the first pair includes a second lower vertex point of the vertex points, and the upper boundary and the lower boundary of the first pair are separated by the predetermined error value.

18. The computer storage module of claim 15, wherein the fifth set of instructions further includes instructions executable by the computer to:

determine whether the first pair of error boundaries is equivalent to the second pair of error boundaries; and if the first pair is equivalent to the second pair, generate a best fit line segment, wherein the best fit line segment is equal to a set of points equidistant from the upper boundary and the lower boundary of the first pair of error boundaries;

if the first pair is not equivalent to the second pair, select an interpolation data point to replace the next data sample, the interpolation data point being selected such that a modification of at least one of the first pair and the second pair of error boundaries to include the interpolation point, results in the first pair of error boundaries being equivalent to the second pair of error boundaries; and generate a best fit line segment, wherein the best fit line segment is equal to the set of points equidistant from the upper boundary and the lower boundary of the first pair of error boundaries.

19. The computer storage module of claim 18, further comprising a sixth set of instructions executable by the computer to:

store data representative of the best fit line segment.

20. The computer storage module of claim 19, wherein the data representative of the best fit line segment includes: a data point of one of the first and second pair of error boundaries; an indication of whether the data point is a data point of one of the upper boundary and the lower boundary of the one of the first pair and the second pair of error boundaries; and a distance from the best fit line segment to a previous best fit line segment.

21. The computer storage module of claim 15, wherein the fourth set of instructions further includes instructions executable by the computer to:

modify the at least one of the first and second pairs of error boundaries only when a distance from the upper boundary to the lower boundary of the one of the first and second pairs of error boundaries increases by a predetermined factor as a result of the modification.

22. An apparatus for compressing a data stream into a series of best fit trend line segments, the data stream having a plurality of data samples, the apparatus comprising:

means for receiving data samples of the plurality of data samples;

means for generating a first pair and a second pair of parallel error boundaries, each of the first pair and the second pair including an upper boundary and a lower boundary separated by a predetermined error value, wherein the upper boundary of the first pair includes a second data sample, the lower boundary of the first pair includes a first data sample, the upper boundary of the second pair includes the first data sample, and the lower boundary of the second pair includes the second data sample;

means for discarding data samples in an area between the upper boundary of the first pair of error boundaries and the lower boundary of the second pair of error boundaries;

means for modifying at least one of the first and second pairs of error boundaries such that each line of the first pair and the second pair of error boundaries includes at least one data sample received by the apparatus and such that for each one of the pair of error boundaries, all data samples of the plurality of data samples received by the apparatus since a last segment end condition are either contained within an area between the upper boundary and the lower boundary of the one of the pair of error boundaries or are located on one of the upper boundary and the lower boundary;

means for generating a best fit line segment of data samples received by the means for receiving and thereby compressing the data stream.

23. The apparatus of claim 22, wherein the means for modifying includes:

means for generating a convex hull defining an area, the convex hull having vertex points corresponding to data samples of the plurality of data samples, the area of the convex hull and the vertex points including all data samples of the data stream received by the apparatus since the last segment end condition;

means for adjusting the first pair of error boundaries such that the upper boundary of the first pair includes a latest data sample, the lower boundary of the first pair includes a first lower vertex point of the vertex points, and the upper boundary and lower boundary of the first pair are separated by the predetermined error value.

24. The apparatus of claim 23, wherein the means for modifying further includes:

means for determining whether any of the vertex points of the convex hull are below the lower boundary of the first pair of error boundaries; and means for pivoting and rolling the upper boundary and the lower boundary such that the upper boundary of the first pair includes the latest data sample, the lower boundary of the first pair includes a second lower vertex point of the vertex points, and the upper boundary and the lower boundary of the first pair are separated by the predetermined error value.

25. The method of claim 22, wherein an out of bounds data sample corresponds to a data sample that lies outside an area between the upper boundary of the first pair and the lower boundary of the second pair and wherein the means for generating a best fit line includes:

means for selecting an interpolation data point to replace an out of bounds data sample, the interpolation data point being selected such that a modification of at least one of the first pair and the second pair of error boundaries to include the interpolation point, results in the first pair of error boundaries being equivalent to the second pair of error boundaries; and means for generating a best fit trend line segment, wherein the best fit trend line segment is equal to a set of points having an equal distance from the upper boundary and the lower boundary of the first pair of error boundaries.

26. The apparatus of claim 22, further comprising:

means for storing data representative of the best fit trend line segment.

27. The apparatus of claim 26, wherein the data representative of the best fit line segment includes: a data point of one of the first and second pair of error boundaries; an indication of whether the data point is a data point of one of the upper boundary and the lower boundary of the one of the first pair and the second pair of error boundaries; and a distance from the best fit line segment to a previous best fit line segment.

28. The apparatus of claim 22, further comprising:

sampling means for sampling an analog stream of data to generate the data samples and provide the data samples to the means for receiving.

29. The apparatus of claim 28, wherein the sampling means includes:

means for sampling the analog stream at a selected sample rate to provide a predetermined time interval between each of the data samples.

30. The apparatus of claim 28, wherein each of the data samples has a first degree of freedom and a second degree of freedom, and wherein the first degree of freedom of each data sample is stored as an incremental value from the first degree of freedom of a previous data sample.

31. The apparatus of claim 22, further comprising a display, coupled to the means for generating a best fit line, that displays the data stream as a series of best fit lines.

* * * * *